United States Patent [19]

Nasr et al.

[11] Patent Number: 5,346,584
[45] Date of Patent: Sep. 13, 1994

[54] PLANARIZATION PROCESS FOR IC TRENCH ISOLATION USING OXIDIZED POLYSILICON FILLER

[75] Inventors: Andre I. Nasr, Marlborough; Steven S. Cooperman, Southborough, both of Mass.

[73] Assignee: Digital Equipment Corporation, Maynard, Mass.

[21] Appl. No.: 98,164

[22] Filed: Jul. 28, 1993

[51] Int. Cl.[5] .................. H01L 21/306; H01L 21/304
[52] U.S. Cl. ...................................... 156/636; 437/67
[58] Field of Search .................. 156/636, 644, 661.1; 437/67, 974

[56] References Cited

U.S. PATENT DOCUMENTS

| 34,400 | 10/1893 | Goto et al. | 148/50 |
|---|---|---|---|
| 4,233,091 | 11/1980 | Kawabe | 148/175 |
| 4,255,207 | 3/1981 | Nicolay et al. | 148/174 |
| 4,473,598 | 9/1984 | Ephrath et al. | 427/86 |
| 4,526,631 | 7/1985 | Silvestri et al. | 148/175 |
| 4,666,556 | 5/1987 | Fulton et al. | 156/643 |
| 4,671,851 | 6/1987 | Beyer et al. | 156/645 |
| 4,689,656 | 8/1987 | Silvestri et al. | 357/49 |
| 4,745,081 | 5/1988 | Beyer et al. | 437/38 |
| 4,783,238 | 11/1988 | Roesner | 156/649 |
| 4,876,216 | 10/1989 | Tobias et al. | 156/646 |
| 5,077,234 | 12/1991 | Scoopo et al. | 437/67 |
| 5,130,268 | 7/1992 | Liou et al. | 437/67 |
| 5,173,439 | 12/1992 | Dash et al. | 437/67 |
| 5,173,439 | 12/1992 | Dash et al. | 437/67 |
| 5,175,122 | 12/1992 | Wang et al. | 437/67 |
| 5,177,028 | 1/1993 | Manning | 437/41 |

FOREIGN PATENT DOCUMENTS 0341898  11/1989  European Pat. Off. ............. 437/67

OTHER PUBLICATIONS

T. H. Daubenspeck, J. K. DeBrosse, C. W. Koburger, M. Armocost, and J. R. Abernathey, "Planarization of ULSI Topography Over Variable Pattern Densities", J. Electrochem. Soc., vol. 138, No. 2, pp. 506-509, Feb. 1991.

B. Davari, C. W. Koburger, R. Schulz, J. D. Warnock, T. Furukawa, M. Jost Y. Taur, W. G. Schwittek, J. K. DeBrosse, M. L. Kerbaugh, and J. L. Mauer, "A New Planarization Technique, Using A Combination of RIE And Chemical Mechanical Polish (CMP)", IEDM Technical Digest, pp. 3.4.1-3.4.4, 1989.

D. J. Sheldon, C. W. Gruenshclaeger, L. Kammerdiner, N. B. Henis, P. Kelleher, and J. D. Hayden, "Application Of A Two-Layer Planarization Process To VLSI Intermetal Dielectric And Trench Isolation Processes", IEEE Transactions Semiconductor Manufacturing, 1, No. 4, pp. 140-145, Nov. 1988.

*Primary Examiner*—Tom Thomas
*Assistant Examiner*—Lynne A. Gurley
*Attorney, Agent, or Firm*—Robert J. Feltovic; Albert P. Cefalo

[57] ABSTRACT

Disclosed is a method of planarizing the surface of a silicon wafer in integrated circuit manufacture where trench isolation techniques are employed. The trenches and active areas on a semiconductor substrate are conformally coated with a layer of silicon oxide. A layer of patterned polysilicon then is deposited on top of the oxide and etched to create filler blocks in depressions above the trenches. Next, the polysilicon is annealed to thereby fill the trenches with an expanded oxide block. The resulting relatively planar surface then is polished back to the nitride cap, to thereby produce a high degree of planarity across all trench and active area dimensions.

10 Claims, 2 Drawing Sheets

PLANARIZATION PROCESS FOR IC TRENCH ISOLATION USING OXIDIZED POLYSILICON FILLER

The present invention relates to semiconductor devices, and, in particular, is directed to a method of planarization in integrated circuit (IC) manufacture where trench isolation is employed.

BACKGROUND OF THE INVENTION

Device isolation typically is achieved by utilizing local oxidation of silicon ("LOCOS") or shallow trench isolation ("STI") techniques. In these device isolation techniques, isolation commonly is provided by forming a recess or trench between two active areas, upon which the electronic devices are located, and filling the trench with an isolation material. Shallow trench isolation serves to provide higher packing density, improved isolation, and greater planarity, by avoiding the topographical irregularities encountered when using conventional thick film oxide isolation. In particular, the growth of thermal field oxide using a mask, such as nitride, creates an encroachment of the oxide into the active areas; this encroachment is referred to as the bird's beak effect. Trench isolation technology includes a planarization process to remove oxide from the active areas and maintain oxide in the trenches. However, in some areas of the wafer face, there will be narrow trenches with narrow active areas between them, while in others there will be wide active areas and wider trenches. Various combinations of trench width and active area width occur, as well, at other places along the face of the wafer due to variations in circuit density. Because of these varying pattern densities, a sufficient degree of uniform planarization sometimes is not achieved. Improved planarity especially is important as device geometries shrink, reducing the photolithography depth of focus at subsequent patterning steps.

Several techniques specifically have been developed for planarization of wafer surfaces as part of trench isolation processing. For example, conformal oxide deposition with etchback has been used successfully to produce local smoothing and planarization, but etching into the trenches does occur when the technique is applied to wide trenches. Another technique for planarization employs spin-on photoresist or glasses, followed by etchback; again, the smoothing is dependent upon the trench geometries, and global planarization is not achieved when variable circuit density is encountered.

While prior techniques have been able to produce adequate planarization over local regions, none of the techniques have been able to accomplish global planarization over large areas of diverse trench patterns. Improved global planarity has been reported by using a two-layer photoresist approach, wherein the first layer is patterned to provide a uniform surface for coating by the second layer. The two layer stack then is etched back to the original level, leaving an essentially planar surface.

An improved resist etch-back technique using three resist layers also has been developed which offers enhanced planarity over the two-resist layers process. In the three-resist layer process, following deposition of a conformal oxide onto a wafer with patterned trenches, the first resist coat is patterned into the trenches to minimize the gap volume prior to the second resist coat, in a manner similar to the technique described above. The second coat then creates a relatively planar resist surface. However, due to photolithographic alignment considerations, there exists a set of trench widths that are too small to receive a resist block, and so the resist is too thin both in these small trenches and on adjacent small active areas. The second coat is therefore etched back in an oxygen chemistry, and a third resist coat is applied, which improves the planarity by increasing the amount of resist in the trenches without a resist block and on the adjacent small active areas. Following the third resist coat, the resist and oxide are then etched back to the silicon nitride with 1:1 selectivity.

Even with the three resist coats, the nonplanarity between the active area/trench regions with and without the resist block results in significant non-planarity across the die following the etch-back. Because of the thinner resist on active areas adjacent to trenches with no resist block, the oxide on these areas will clear first during the etch, and will continue to etch along the active area sidewall while waiting for larger active areas to clear. Another problem is that a final etch step with reduced resist etch rate is required to avoid punching through the trenches with no resist block, resulting in the appearance of oxide spikes adjacent to the active areas when the remaining resist above the trenches is subsequently stripped. The exposure of the active area sidewall and the oxide spikes can be avoided by leaving a small amount of oxide on the active areas, and performing a chemical mechanical polish until the oxide is completely removed from the nitride on all features. The polishing step smoothes the wafer surface and provides global planarization. The polishing step also makes the planarization process less sensitive to variations in localized resist non-planarity.

The combined resist etch-back with chemical mechanical polish process therefore offers a significantly improved shallow-trench isolation process, but there are still several problems associated with the technique: 1) the multiple resist coats and etches associated with resist etch-back result in accumulated tolerances that make the process difficult to control, even with the final chemical mechanical polish step; 2) the final nitride thickness range varies significantly between various active area/trench structures, due to both resist etch-back (e.g., active area structures adjacent to trenches with no filler have less oxide and so will polish to nitride more quickly) and chemical mechanical polish (e.g., small isolated active areas will polish more rapidly than large and/or dense active areas, even with the significantly reduced step height provided by resist etch-back); the result is that a significantly thicker nitride layer remains on large active areas than on small active areas, and so following the nitride strip the step height will vary depending on the feature size and pattern density, and a fairly large step will remain adjacent to large active areas; 3) the field oxide will be polished in wide trenches during chemical mechanical polish (a phenomenon referred to as dishing), reducing the final global planarity; 4) some pad deformation will occur across very large active areas, requiring an extended overpolish to ensure removal of oxide from the center of these features; this increases the nitride thickness range described in problem (2), and worsens planarity due to the slower polish rate of the nitride relative to the field oxide; 5) the extent of the effects described in problems (2), (3), and (4), will vary from one chip design to another, depending on the size of the largest active area, the proximity of large active areas to one another, the spacing between small isolated active areas, and the largest trench width. These effects can be reduced but not eliminated with undesirable layout rules imposed on circuit designs.

Accordingly, although various improvements in planarization methods have been developed, manufacturability problems still exist related to final nitride thickness variation between isolated and dense areas as well as non-uniform resist coat and etch-back.

SUMMARY OF THE INVENTION

Now, an improved planarization method has been developed whereby shallow trenches filled with dielectric material exhibit a high degree of global planarity virtually independent of device dimensions. According to the presently invented method, a layer of dielectric material is conformally deposited onto a semiconductor substrate, which features active area mesas and trenches, typically formed by depositing silicon nitride, usually with a thermal oxide base coating, over the semiconductor substrate and then patterning and etching using conventional photolithographic techniques and reactive ion etching. The dielectric layer is of uniform thickness and conforms with the etched surface of the substrate to thereby form depressions above the trenches. The dielectric material can be any suitable dielectric or material convertible to dielectric material. Suitable such materials include silicon, silicon oxide, silicon nitride, silicon implanted with nitrogen, and the like. A layer of silicon is deposited on top of the dielectric, and this silicon film then is patterned and etched to create silicon filler blocks and, preferably, silicon spacers in the depressions above the trenches. The silicon is oxidized in a high temperature anneal, thereby filling the trench with an oxide block and creating a relatively planar surface. Next, the wafer is polished back to the top of the active area mesas cap, resulting in shallow trenches filled with dielectric material, exhibiting a high degree of planarity across all trench and active area dimensions.

The present invention effectively eliminates wide trenches and isolated features at the polishing step. This results in significantly reduced nitride thickness range, minimal dishing of the field oxide, minimum overpolish for clearing of the center of large active areas, and reduced variance in process characteristics between various chip designs. In addition, by eliminating resist etch-back from the process flow, the planarization process is simplified and is easier to control.

BRIEF DESCRIPTION OF THE DRAWINGS

For a further understanding of the nature of the present invention, as well as other features and advantages thereof, reference should be made to the following detailed description taken in conjunction with the accompanying drawings wherein.

DETAILED DESCRIPTION OF PREFERRED EMBODIMENTS

Figure 1:
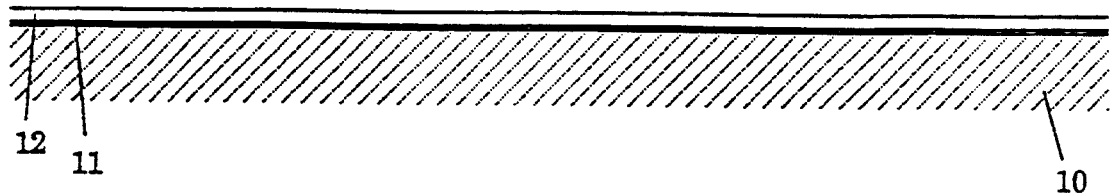
FIGS. 1-6 are simplified, magnified, cross-sectional views depicting, in sequence, the process steps for planarization of shallow trenches according to the present invention.

Referring to FIG. 1, a silicon semiconductor substrate 10 is shown, which features a thermally grown oxide layer 11 and a deposited silicon nitride layer 12. Typical dimensions for such layers on a silicon substrate would be an oxide layer of about 225 Å thickness and a deposited nitride layer of about 1800 Å thickness.

Figure 2:
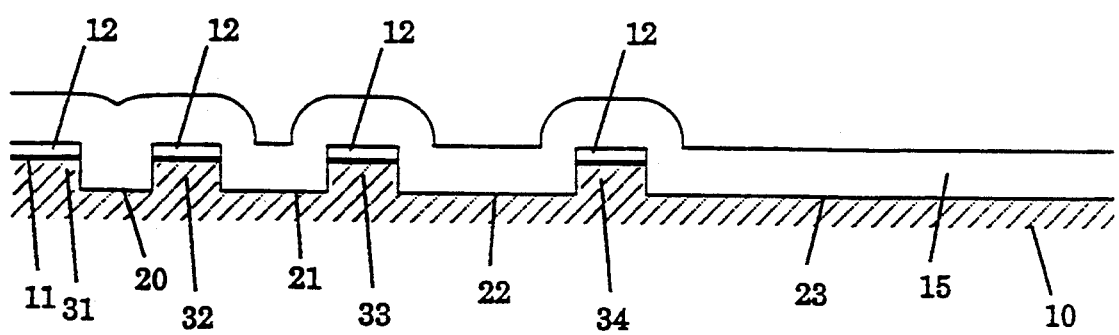

In order to define and form shallow trenches, a photoresist is applied to cover the nitride layer 12, and the face of the silicon substrate then is exposed to light through a mask defining the desired pattern of trenches. The photoresist is developed, and then is subjected to an anisotropic etch, typically a conventional plasma etch system, such as "RIE" reactive ion etch with either $Cl_2$ or $Cl_2$ and HBr, to create trenches, such as 20, 21, 22, and 23 between active areas 31, 32, 33, and 34 as illustrated in FIG. 2. A typical trench depth is about 0.4 to about 0.5 $\mu$m. The photoresist then is stripped and a conformal dielectric layer, in this example oxide coating 15, is deposited onto the substrate. The conformal dielectric layer preferably is a silicon oxide, or a material convertible to a silicon oxide, to present a planar surface featuring uniform polishing rate across the substrate. The conformal oxide, preferably TEOS (tetraethylorthosilicate), forms an oxide coating 15 of uniform thickness that coats the sidewalls of the trenches at the same thickness as the coating of the flat face surface areas. The oxide generally is applied at a thickness so that the level of the top of oxide 15 in the trenches is at about the same level as the top of the nitride layer 12 on the active areas. A typical thickness of the oxide coating 15 is about 5500 Å.

Figure 3:
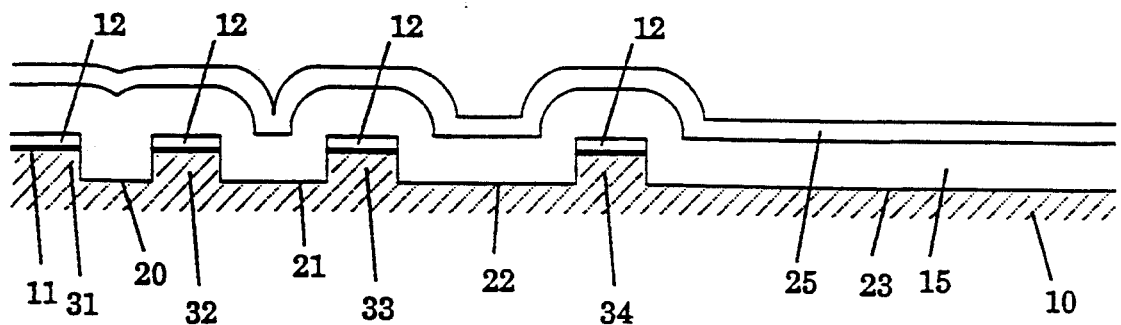
Figure 4:
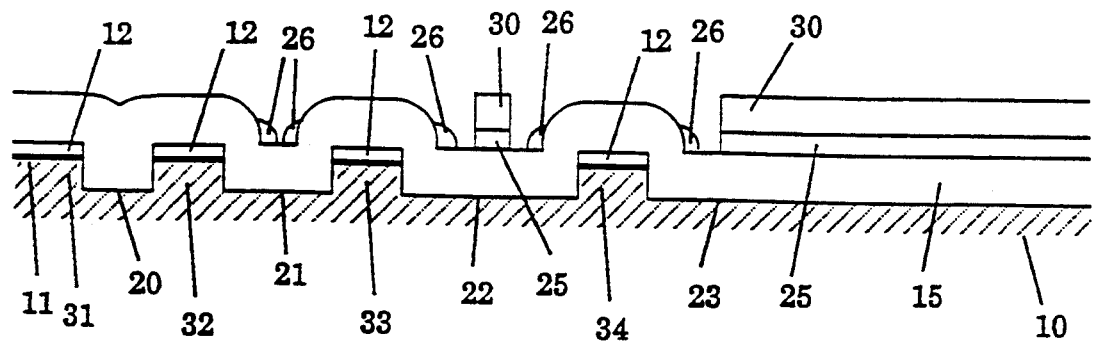

Following deposition of the oxide coating 15, a conformal layer of silicon 25 then is deposited, as shown in FIG. 3. The deposited silicon may be amorphous or polysilicon. For purposes of illustration, polysilicon will be used in the embodiment described below. A typical thickness of the silicon layer is about 2500 Å. Next, the polysilicon layer 25 is coated with photoresist and, with conventional photolithographic techniques, using a "filler mask", is patterned to form resist blocks in the depressions above the trenches, between adjacent active areas. The filler mask is a reverse-tone of the active area mask that is under-sized so as to pattern the resist blocks to sit in the depressions between adjacent active areas without encroaching onto the polysilicon shoulders along sidewalls of the depressions. After the resist blocks have been patterned, the un-patterned polysilicon layer 25 is plasma etched, resulting in segments of polysilicon 25 remaining beneath the patterned resist blocks 30 as depicted in FIG. 4. The polysilicon etch preferably is specifically limited in duration so as intentionally to leave polysilicon sidewall spacers 26 along the sidewalls of the depressions above the trenches. These sidewall spacers 26 are not required according to the process, but, they do serve to enhance the degree of trench fill by occupying the space between the remaining segments of polysilicon 25 and the oxide coating over the active areas. Sidewall spacers 26 further serve to partially fill depressions above narrower trenches, such as 21, which are not wide enough to accommodate the resist block technique due to photolithographic alignment tolerances.

Figure 5:
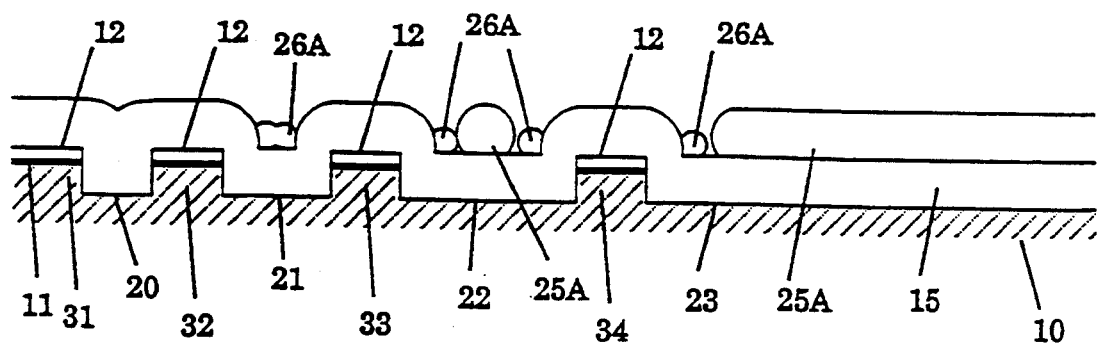

The patterned resist (resist blocks 30) next is stripped, and the wafer is subjected to a high temperature anneal in an oxidizing ambient atmosphere to oxidize the remaining polysilicon 25 and 26 and convert it to oxide filler 25A and oxide spacers 26A (FIG. 5). Advantageously, the polysilicon expands both outward and upward during the annealing/oxidation process, resulting in more than doubling the original volume of the remaining polysilicon. For example, a typical polysilicon layer having a thickness of about 2500 Å would produce an oxide filler having a thickness of about 5500 A. Accordingly, by factoring the oxidation expansion of the polysilicon into the engineering of the process, polysilicon layer 25 can be applied at a thickness such that after oxidation and expansion, the final oxide filler 25A will be substantially at the same level as the oxide on the active areas of the substrate. A further inherent advantage of the oxidized polysilicon filler is that it is effective in filling smaller trenches which might not accommodate a filler block of the final expanded size but can accept a smaller segment of polysilicon, since the segment is only a fraction of its final expanded oxide size.

Figure 6:
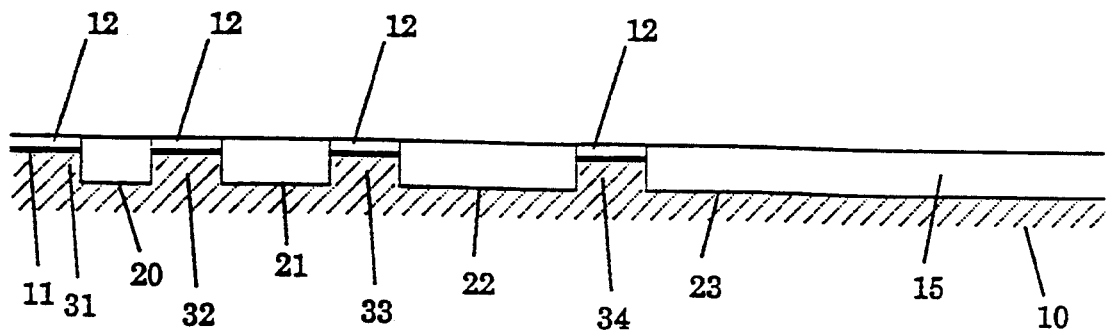

The substrate with oxide-filled trenches then is subjected to chemical mechanical polishing, using, for example, a polishing pad and a silica slurry polishing medium. The wafer is polished to the level of the nitride, as depicted in FIG. 6, to result in a planar structure featuring active areas covered by silicon nitride 12 separated by shallow trench areas 20, 21, 22, and 23 filled with oxide 15 to the same level as the nitride caps.

The wafers with oxide-filled trenches produced according to the present invention exhibit several advantages making them particularly suited for chemical mechanical polishing to a uniform, global planarization. First, the presently produced wafer with oxide-filled trenches already is relatively planar entering the final polish step, except for small narrow depressions above the oxidized spacers 26A. The polishing pad, however, will readily bridge across these narrow depressions and not cause erosion over-polishing of the field oxide above the trenches. Secondly, because no resist planarization is employed, the oxide thickness is uniform across all active area structures regardless of active area size or spacing. This initial uniformity, coupled with polishing rates virtually independent of feature size because of the planarity afforded by the oxidized filler, results in a very small range in nitride thickness across active areas of various sizes. Thirdly, pad deformation across large active areas is minimized because the polishing pad is supported in the field areas by the oxidized filler, reducing the amount of overpolish required to clear the center of large active areas.

While the invention has been described with reference to specific embodiments thereof, it is intended that all matter contained in the above description or shown in the accompanying drawings be interpreted as illustrative and not limiting in nature. Various modifications of the disclosed embodiments, as well as other embodiments of the invention, will be apparent to those skilled in the art upon reference to this description, or may be made without departing from the spirit and scope of the invention defined in the appended claims.

We claim:

1. A method of planarizing a face of a semiconductor substrate comprising:
   forming flat active area mesas and trenches on said face;
   depositing a conformal coating of a dielectric material or a material converted to a dielectric material over said face, forming depressions above said trenches;
   depositing a layer of silicon over the conformal coating;
   patterning the silicon layer with a photoresist to form resist blocks in the depressions above said trenches;
   etching said silicon to leave silicon segments remaining in the areas beneath the resist blocks;
   annealing the silicon to convert said silicon to oxide;
   polishing the face of the semiconductor substrate with dielectric filled trenches to the level of the tops of the active areas so as to produce a substantially planar surface.

2. The method of claim 1 wherein said etching is controlled so as to leave silicon spacers along sidewalls of the depressions.

3. The method of claim 1 wherein said forming comprises etching that is patterned to form active areas and trenches of varying widths.

4. The method of claim 1 wherein said semiconductor substrate is silicon.

5. The method of claim 1 wherein said conformal coating is selected from the group consisting of silicon, silicon oxide, silicon nitride, silicon implanted with nitrogen, and "tetraethylorthosilicate".

6. The method of claim 5 wherein the dielectric material is a silicon oxide.

7. The method of claim 5 wherein the dielectric material is tetraethylorthosilicate.

8. The method of claim 1 wherein the dielectric material is deposited in a thickness so that the level of the top of the dielectric in the trenches is at about the same level as the top of the active area mesas.

9. The method of claim 8 wherein the silicon layer is deposited in a layer having a thickness about half of the depth of the depressions above the trenches so that after annealing and expansion, the level of the top of the dielectric is about the same as the top of the dielectric coating on the active area mesas.

10. A method of planarizing a face of a silicon substrate comprising:
   etching said face to form flat active area mesas and trenches;
   depositing a conformal coating of a silicon oxide over said face, in a thickness such that the level of the top of the oxide in the trenches is at about the same level as the top of the active area mesas, forming depressions above said trenches;
   depositing a layer of polysilicon over the conformal oxide coating, said polysilicon having a thickness about half the depth of the depressions above said trenches;
   patterning the polysilicon layer with a photoresist to form resist blocks in the depressions above said trenches;
   etching said polysilicon to leave polysilicon segments remaining in the areas beneath the resist blocks;
   annealing the polysilicon to convert said polysilicon to oxide;
   polishing the face of the semiconductor substrate with oxide filled trenches to the level of the tops of the active areas so as to produce a substantially planar surface.

* * * * *